United States Patent
Lee et al.

(10) Patent No.: US 12,422,592 B2
(45) Date of Patent: Sep. 23, 2025

(54) ANTI-GLARE FILM, POLARIZING PLATE AND DISPLAY APPARATUS

(71) Applicant: LG CHEM, LTD., Seoul (KR)

(72) Inventors: Hanna Lee, Daejeon (KR); Jung Hyun Seo, Daejeon (KR); Yeongrae Chang, Daejeon (KR)

(73) Assignee: Xinmei Fontana Holding (Hong Kong) Limited, Hong Kong (CN)

( * ) Notice: Subject to any disclaimer, the term of this patent is extended or adjusted under 35 U.S.C. 154(b) by 559 days.

(21) Appl. No.: 17/909,289

(22) PCT Filed: Mar. 2, 2021

(86) PCT No.: PCT/KR2021/002543
§ 371 (c)(1),
(2) Date: Sep. 2, 2022

(87) PCT Pub. No.: WO2021/177689
PCT Pub. Date: Sep. 10, 2021

(65) Prior Publication Data
US 2023/0087678 A1    Mar. 23, 2023

(30) Foreign Application Priority Data

Mar. 5, 2020  (KR) .................. 10-2020-0027918
Mar. 10, 2020 (KR) .................. 10-2020-0029751

(51) Int. Cl.
| | | |
|---|---|---|
| G02B 1/111 | (2015.01) | |
| G02B 1/14 | (2015.01) | |
| G02B 5/02 | (2006.01) | |
| G02B 5/20 | (2006.01) | |
| G02B 5/30 | (2006.01) | |
| G02F 1/1335 | (2006.01) | |
| H10H 20/856 | (2025.01) | |

(52) U.S. Cl.
CPC ............. *G02B 1/111* (2013.01); *G02B 1/14* (2015.01); *G02B 5/0242* (2013.01); *G02B 5/206* (2013.01); *G02B 5/305* (2013.01); *G02B 5/3083* (2013.01); *G02F 1/133502* (2013.01); *H10H 20/856* (2025.01)

(58) Field of Classification Search
CPC .. G02B 1/111; G02B 1/14; G02B 1/11; G02B 1/118; G02B 5/0242; G02B 5/206; G02B 5/305; G02B 5/3083; G02B 5/02; G02B 5/021; G02B 5/0221; G02B 5/0226; G02B 5/0236; G02B 5/0278; H10H 20/856; H10H 29/856; G02F 1/133502
See application file for complete search history.

(56) References Cited

U.S. PATENT DOCUMENTS

| | | | |
|---|---|---|---|
| 7,542,207 B2 | 6/2009 | Matsunaga | |
| 7,567,383 B2 | 7/2009 | Nagahama et al. | |
| 7,751,121 B2 | 7/2010 | Nagahama et al. | |
| 7,903,340 B2 | 3/2011 | Nagahama et al. | |
| 8,488,079 B2 | 7/2013 | Kodama et al. | |
| 9,995,953 B2 * | 6/2018 | Kuroda | G02B 1/11 |
| 10,539,720 B2 | 1/2020 | Serizawa et al. | |
| 2008/0241524 A1 * | 10/2008 | Fukuda | B32B 27/30 |
| | | | 428/336 |
| 2009/0316269 A1 | 12/2009 | Kim et al. | |
| 2012/0092773 A1 | 4/2012 | Liu et al. | |
| 2012/0105769 A1 | 5/2012 | Fukuda et al. | |
| 2013/0279155 A1 | 10/2013 | Kuroda et al. | |
| 2014/0254021 A1 | 9/2014 | Furui et al. | |
| 2015/0301237 A1 * | 10/2015 | Hayashi | G02B 5/0221 |
| | | | 359/601 |
| 2017/0066207 A1 | 3/2017 | Hayashi et al. | |
| 2017/0320281 A1 | 11/2017 | Hayashi et al. | |
| 2018/0009959 A1 | 1/2018 | Nakashima et al. | |
| 2018/0313978 A1 | 11/2018 | Chang et al. | |
| 2018/0364400 A1 | 12/2018 | Eguchi et al. | |
| 2019/0204677 A1 | 7/2019 | Kim et al. | |
| 2019/0351632 A1 | 11/2019 | Hayashi et al. | |
| 2020/0233119 A1 * | 7/2020 | Sugawara | H05B 33/02 |
| 2020/0400860 A1 | 12/2020 | Seo et al. | |
| 2021/0141123 A1 | 5/2021 | Sugawara et al. | |
| 2023/0163265 A1 * | 5/2023 | Lee | G02B 5/0242 |
| | | | 257/79 |

FOREIGN PATENT DOCUMENTS

| | | | |
|---|---|---|---|
| CN | 101726768 A | 6/2010 | |
| CN | 103858025 A | 6/2014 | |
| CN | 105005104 A | 10/2015 | |

(Continued)

OTHER PUBLICATIONS

International Search Report issued for International Application No. PCT/KR2021/002542 on Jun. 14, 2021, 2 pages.
International Search Report issued for International Application No. PCT/KR2021/002543 on Jun. 14, 2021, 2 pages.
Extended European Search Report issued for corresponding European Patent Application No. 21763549.9 dated Jun. 6, 2023, 7 pages.
Extended European Search Report issued for corresponding European Patent Application No. 21765454.0 dated Jun. 7, 2023, 7 pages.

*Primary Examiner* — Stephone B Allen
*Assistant Examiner* — Adam W Booher
(74) *Attorney, Agent, or Firm* — Ricky Lam

(57) ABSTRACT

This invention relates to an anti-glare film comprising a laminate comprising a light transmitting substrate, and a hard coating layer comprising a binder resin and organic particles and inorganic particles dispersed in the binder resin, satisfying a difference between the total haze and internal haze, peak area rate of IR spectrum and transmission diffusion distribution within specific ranges, and a polarizing plate and a display apparatus comprising the same.

15 Claims, No Drawings

(56) References Cited

FOREIGN PATENT DOCUMENTS

| | | | |
|---|---|---|---|
| CN | 105044969 A | 11/2015 |
| CN | 106652809 A | 5/2017 |
| CN | 107108934 A | 8/2017 |
| JP | H10-300908 A | 11/1998 |
| JP | 2003-248101 A | 9/2003 |
| JP | 2003-302506 A | 10/2003 |
| JP | 2009-169409 A | 7/2009 |
| JP | 2009-256559 A | 11/2009 |
| JP | 2010-122710 A | 6/2010 |
| JP | 2012-098425 A | 5/2012 |
| JP | 2014-016602 A | 1/2014 |
| JP | 2014-026122 A | 2/2014 |
| JP | 2014-112257 A | 6/2014 |
| JP | 2015-206841 A | 11/2015 |
| JP | 2019-105692 A | 6/2019 |
| JP | 2020-016881 A | 1/2020 |
| JP | 2021-513109 A | 5/2021 |
| KR | 10-2008-0056381 A | 6/2008 |
| KR | 10-2008-0076768 A | 8/2008 |
| KR | 10-2009-0104061 A | 10/2009 |
| KR | 10-2010-0073252 A | 7/2010 |
| KR | 10-2012-0028741 A | 3/2012 |
| KR | 10-1161696 B1 | 7/2012 |
| KR | 10-1273789 B1 | 6/2013 |
| KR | 10-2014-0072865 A | 6/2014 |
| KR | 10-2015-0056361 A | 5/2015 |
| KR | 10-2015-0120264 A | 10/2015 |
| KR | 10-2017-0015196 A | 2/2017 |
| KR | 10-2017-0031640 A | 3/2017 |
| KR | 10-2017-0057087 A | 5/2017 |
| KR | 10-2018-0002744 A | 1/2018 |
| KR | 10-2018-0024347 A | 3/2018 |
| KR | 10-2018-0093094 A | 8/2018 |
| KR | 10-2018-0116739 A | 10/2018 |
| KR | 10-2019-0003232 A | 1/2019 |
| KR | 10-2019-0006820 A | 1/2019 |
| KR | 10-2019-0129553 A | 11/2019 |
| KR | 10-2019-0141320 A | 12/2019 |
| KR | 10-2019-0141746 A | 12/2019 |
| KR | 10-2074296 B1 | 2/2020 |
| KR | 10-2020-0052777 A | 5/2020 |
| WO | 2013-054805 A1 | 4/2013 |
| WO | 2016-030738 A1 | 3/2016 |
| WO | 2017-061493 A1 | 4/2017 |
| WO | 2018-186472 A1 | 10/2018 |

* cited by examiner

ANTI-GLARE FILM, POLARIZING PLATE AND DISPLAY APPARATUS

FIELD OF THE INVENTION

Cross-Reference to Related Application(S)

This application claims the benefit of Korean Patent Application No. 10-2020-0027918 filed on Mar. 5, 2020 and Korean Patent Application No. 10-2020-0029751 filed on Mar. 10, 2020 with the Korean Intellectual Property Office, the disclosures of which are herein incorporated by reference in their entirety.

This invention relates to an anti-glare film, a polarizing plate, and a display apparatus comprising the same.

BACKGROUND OF THE INVENTION

A FPD(Flat Panel Display), if exposed to external light such as natural light, causes fatigue to the eyes of users or induces headache due to surface reflected light, and the image formed inside a display is not recognized as a clear image. In order to solve such disadvantages, irregularities were formed on the display surface to scatter external light on the surface, or an anti-glare film was applied to induce subsurface scattering using refractive index difference between particles and resin forming a coating film.

However, in case the anti-glare film is applied to displays requiring high resolution and pixel density, such as OLED, mini-LED, micro-LED, and the like, the surface irregularities formed on the surface of the anti-glare film serve as lens significantly refracting light coming from the pixel, thus generating sparkling, and distorting image expression to deteriorate image sharpness.

Thus, there is a demand for the development of technology for controlling the size and cohesion of surface irregularities of the anti-glare films applied to displays requiring high resolution and pixel density, such as OLED, mini-LED, micro-LED, and the like, thereby preventing sparkling and improving image sharpness.

BRIEF SUMMARY OF THE INVENTION

Technical Problem

It is an object of the invention to provide an anti-glare film that exhibits excellent anti-glare property, and simultaneously, prevents sparkling, and exhibits excellent optical properties such as high transmittance, and simultaneously, has excellent physical properties such as scratch resistance, high intensity and anti-pollution property, and the like.

It is another object of the invention to provide a polarizing plate comprising the anti-glare film.

It is another object of the invention to provide a display apparatus comprising the anti-glare film and providing high screen sharpness.

Technical Solution

There is provided herein an anti-glare film comprising: a laminate comprising a light transmitting substrate, and a hard coating layer comprising a binder resin and inorganic particles and organic particles dispersed in the binder resin,
wherein a difference(Ha−Hi) between the total haze(Ha) and the internal haze(Hi) of the laminate is 5 to 15%, and
in the IR spectrum of the laminate, a rate($I_B/I_A$) of the peak area ($I_B$) existing between 1500 cm$^{-1}$ to 1570 cm$^{-1}$, to the peak area ($I_A$) existing between 1690 cm$^{-1}$ to 1745 cm$^{-1}$ is 0.1 to 0.6, and
transmission diffusion distribution of the laminate according to the following Formula 1 is greater than 1% and less than 10%:

$$\text{transmission diffusion distribution} = (B/A) \times 100 \quad \text{[Formula 1]}$$

wherein A is transmission intensity of light transmitted in the normal direction of the hard coating layer, after irradiating light in the normal direction of the light transmitting substrate, and B is transmission diffusion intensity of light transmitted at +1° or −1° based on the normal of the hard coating layer, after irradiating light in the normal direction of the light transmitting substrate.

There is also provided herein a polarizing plate comprising the anti-glare-film.

There is also provided herein a display apparatus comprising the anti-glare-film.

DETAILED DESCRIPTION OF THE INVENTION

Hereinafter, an anti-glare film, and a polarizing plate and a display apparatus comprising the same according to specific embodiments of the invention will be explained in detail.

As used herein, (meth)acrylate includes both acrylate and methacrylate.

And, as used herein, weight average molecular weight (Mw) means molecular weight of polystyrene conversion (unit: Da(Dalton)) measured by gel permeation chromatography(GPC). In the process of measuring weight average molecular weight of polystyrene conversion by GPC method, commonly known analysis equipment, detectors such as refractive index detector, and analysis column may be used, and commonly applied temperature conditions, solvents and flow rate may be applied. For example, using Polymer Laboratories PLgel MIX-B 300 mm length column and Waters PL-GPC220 instrument, at a temperature of 160° C., using 1,2,4-trichlorobenzene as a solvent, at a flow rate of 1 mL/min, a sample is prepared at a concentration of 10 mg/10 mL, and then, fed in an amount of 200 μL, and Mw may be calculated using a calibration curve formed using polystyrene standards. As polystyrene standards, 9 kinds having molecular weights of 2,000/10,000/30,000/70,000/200,000/700,000/2,000,000/4,000,000/10,000,000 are used.

According to one embodiment of the invention, there is provided an anti-glare film comprising: a laminate comprising a light transmitting substrate, and a hard coating layer comprising a binder resin and inorganic particles and organic particles dispersed in the binder resin, wherein a difference(Ha−Hi) between the total haze(Ha) and the internal haze(Hi) of the laminate is 5 to 15%, and in the IR spectrum of the laminate, a rate($I_B/I_A$) of the peak area ($I_B$) existing between 1500 cm$^{-1}$ to 1570 cm$^{-1}$, to the peak area ($I_A$) existing between 1690 cm$^{-1}$ to 1745 cm$^{-1}$ is 0.1 to 0.6, and transmission diffusion distribution of the laminate according to the above Formula 1 is greater than 1% and less than 10%.

The inventors of this invention confirmed that if an anti-glare film comprises a laminate comprising a light transmitting substrate and a hard coating layer comprising a binder resin, and inorganic particles and organic particles, wherein a difference between the total haze(Ha) and the internal haze(Hi) of the laminate is 5 to 15%, the peak area rate($I_B/I_A$) of the laminate is 0.1 to 0.6, and the transmission diffusion distribution of the laminate is greater than 1% and less than 10%, excellent anti-glare property may be exhibited, and even if applied for a display panel requiring high resolution, sparkling may not be generated, and completed the invention.

Specifically, the above-explained specific ranges of difference between the total haze(Ha) and the internal haze(Hi), peak area rate, and transmission diffusion distribution of the anti-glare film may result from the binder resin composition of the hard coating layer, the diameters of the organic particles and inorganic particles dispersed in the binder resin, or weight ratio of the organic particles and inorganic particles, and the like.

A difference(Ha−Hi) between the total haze(Ha) and the internal haze(Hi) of the laminate included in the anti-glare film may be 5 to 15%, 7 to 14%, or 9 to 13%. If a difference between the total haze and the internal haze is less than 5%, anti-glare effect obtained by external irregularities may be deteriorated, and if it is greater than 15%, sparkling may become serious and image sharpness may be lowered.

The total haze(Ha) of the laminate may be 20% to 50%, 25% to 45%, or 30% to 40%. If the total haze is too small, sparkling may be generated or anti-glare property may not be exhibited, and if the total haze is too large, a degree of dynamic scattering of a film may increase, and thus, a contrast ratio may be lowered.

And, the internal haze of the laminate may be 10% to 40%, 15% to 35%, or 20% to 30%. If the internal haze is too small, sparkling may be generated, and if the internal haze is too large, a degree of dynamic scattering of a film may increase, and thus, a contrast ratio may be lowered.

In the IR spectrum of the laminate included in the anti-glare film, a rate($I_B/I_A$) of the peak area ($I_B$) existing between 1500 cm$^{-1}$ to 1570 cm$^{-1}$, to the peak area ($I_A$) existing between 1690 cm$^{-1}$ to 1745 cm$^{-1}$ may be 0.10 to 0.60, 0.20 to 0.58, or 0.30 to 0.55. If the peak area rate($I_B/I_A$) is less than 0.10, irregularities may not be uniformly formed in the form of protrusions, and thus, sparkling may be generated, and if it is greater than 0.60, the formation of irregularities by the aggregation of particles may be deteriorated, and thus, anti-glare effect may be deteriorated.

The IR spectrum may be measured using Cary 660 (Agilent) for the hard coating layer of the anti-glare film, and the measurement conditions may include a temperature condition of 20 to 25° C. and humidity condition of 40 to 50%.

The transmission diffusion distribution of the laminate included in the anti-glare film, according to the following Formula 1, may be greater than 1% and less than 10%, 3% to 8%, or 4% to 7%. If the transmission diffusion distribution is 1% or less, anti-glare effect may be deteriorated, and if it is 10% or more, sparkling may be generated.

$$\text{transmission diffusion distribution} = (B/A) \times 100 \quad \text{[Formula 1]}$$

wherein A is transmission intensity of light transmitted in the normal direction of the hard coating layer, after irradiating light in the normal direction of the light transmitting substrate, and B is transmission diffusion intensity of light transmitted at +1° or −1° based on the normal of the hard coating layer, after irradiating light in the normal direction of the light transmitting substrate.

Specifically, in the transmission diffusion distribution, transmission intensity(A) and transmission diffusion intensity(B) may be distinguished respectively as the transmission intensity(A) and transmission diffusion intensity(B), according to the measurement angle of transmitted light, when irradiated light is transmitted to the hard coating layer, after irradiating light in the normal direction of the light transmitting substrate. Specifically, the intensity of transmitted light measured in the normal direction of the hard coating layer is transmission intensity(A), and it may be defined as specular transmission intensity. And, the intensity of transmitted light measured at +1° or −1° based on the normal of the hard coating layer is transmission diffusion intensity(B).

Wherein, when measuring the transmission intensity(A) and transmission diffusion intensity(B), the intensity of light irradiated in the normal direction of the light transmitting substrate is constant, and specifically, in case the intensity of light irradiated in the normal direction of the light transmitting substrate is 100, the transmission intensity(A) may be 10 to 60, 20 to 50, or 25 to 45, and the transmission diffusion intensity(B) may be 0.1 to 6, 0.2 to 5, or 0.25 to 4.5.

The specular reflection intensity rate of the laminate included in the anti-glare film, according to the following Formula 2, may be greater than 1% and less than 10%, 3% to 8%, or 4% to 7%. If the specular reflection intensity rate is 1% or less, sparkling may be generated or image sharpness may be lowered, and if it is 10% or more, anti-glare effect maybe deteriorated.

$$\text{Specular reflection intensity rate} = (C/D) \times 100 \quad \text{[Formula 2]}$$

in the Formula 2,

C is reflection intensity measured at 45° corresponding to specular reflectance of, after irradiating light at the incidence angle of 45° to the hard coating layer, and D is reflection intensity measured at 45° corresponding to specular reflectance, after irradiating light at the incidence angle of 45° to the light transmitting substrate.

The specular reflection intensity rate of the Formula 2 calculates reflection intensity(C) measured for the hard coating layer, to reflection intensity(D) measured for the light transmitting substrate, as percentage.

If light is irradiated at an angle of 45° from the normal of a plane to the hard coating layer or light transmitting substrate, a part of light is diffused at 45° corresponding to specular reflection, wherein the intensity of light measured at 45°, which is the specular reflection direction of the incident angle, is defined as reflection intensity(C) and reflection intensity(D) respectively according to the measurement subject. And, in order to inhibit back reflection and adjust to practical use conditions, a non-light-transmitting substrate is put on the other side of the measurement subject.

The non-light-transmitting substrate is a substrate having light transmittance of approximately 0%, where light such as visible light is not transmitted at all, and for example, it may be a black acryl plate, a black strawboard, or a film coated with black adhesive. The film coated with black adhesive may be, for example, a polyethylene terephthalate film coated with black adhesive.

More specifically, in order to measure the reflection intensity(C), first, a flat non-light-transmitting substrate without irregularity or flexure is put on one side of the light transmitting substrate, so as to oppose the hard coating layer. And then, light flux is entered at an angle of 45° from the normal to the hard coating layer, and reflection intensity(C) may be measured at 45°, which corresponds to the specular reflection direction of the incident angle. The reflection intensity(C) may be 1000 to 6000, 1500 to 5000, or 2000 to 4000.

And, in order to measure the reflection intensity(D), only a light transmitting substrate on which a hard coating layer is not formed is prepared, and a non-light-transmitting substrate is put on one side of the light transmitting substrate. And then, to one side of the light transmitting substrate on which the non-light-transmitting substrate is not put, light flux is entered at an angle of 45° from the normal, and the reflection intensity(D) may be measured at 45°, which corresponds to the specular reflection direction of incident angle. The reflection intensity(D) may be 50000 to 70000, 52000 to 68000, or 55000 to 65000.

The anti-glare film comprises a hard coating layer, and the hard coating layer comprises a binder resin and inorganic particles and organic particles dispersed in the binder resin.

The binder resin may comprise multifunctional (meth) acrylate-based monomers and urethane (meth)acrylate oligomers.

The multifunctional (meth)acrylate-based monomers may include two or more, 3 to 10, or 4 to 9 (meth)acrylate-based functional groups, and have weight average molecular weight of 1,500 g/mol or less, or 1,000 g/mol or less.

Such multifunctional (meth)acrylate-based monomers may be one or more selected from the group consisting of pentaerythritol tri(meth)acrylate, pentaerythritol tetra(meth) acrylate, dipentaerythritol penta(meth)acrylate, dipentaerythritol hexa(meth)acrylate, tripentaerythritol hepta(meth)acrylate, trilene diisocyanate, xylene diisocyanate, hexamethylene diisocyanate, trimethylolpropane tri(meth) acrylate, trimethylolpropane polyethoxy tri(meth)acrylate, trimethylolpropane trimethacrylate, ethyleneglycol dimethacrylate, butanediol dimethacrylate, hexaethyl methacrylate, and butyl methacrylate, but not limited thereto.

The urethane (meth)acrylate oligomers may include 2 or more, 3 to 20, or 4 to 15 (meth)acrylate-based functional groups, and have weight average molecular weight of 700 g/mol to 10,000 g/mol, or 1,000 g/mol to 8,000 g/mol, or 1,500 g/mol to 5,000 g/mol.

And, the urethane (meth)acrylate oligomers may have equivalent weight of (meth)acrylate-based functional groups of 100 to 500 g/mol, 150 g/mol to 450 g/mol, or 200 g/mol to 400 g/mol. Such equivalent weight of functional groups is a value obtained by dividing the molecular weight of polysiloxane by the number of functional groups, and it may be analyzed by H-NMR or chemical titration.

The urethane (meth)acrylate oligomers may be, although not limited hereto, urethane modified acrylate oligomers, epoxide acrylate oligomers, ether acrylate oligomers, dendritic acrylate oligomers, or a mixture of two or more kinds thereof.

The weight ratio of the multifunctional (meth)acrylate-based monomers and urethane (meth)acrylate oligomers included in the hard coating layer may be 3:7 to 7:3, 4:6 to 7:3, 5:5 to 지 7:3, or 6:4 to 7:3. If the content of the multifunctional (meth)acrylate-based monomers is too large compared to the urethane (meth)acrylate oligomers, excessively large irregularities may be formed on the hard coating layer, and thus, the transmission diffusion distribution may become 10% or more, thus generating sparkling and lowering image sharpness. Meanwhile, the content of the multifunctional (meth)acrylate-based monomers is too small compared to the urethane (meth)acrylate oligomers, irregularities may be scarcely formed on the hard coating layer, and thus, external haze may be lowered, and the transmission diffusion distribution may become 1% or less, thus deteriorating anti-glare effect.

The hard coating layer included in the anti-glare film according to one embodiment not only comprises a binder resin comprising multifunctional (meth)acrylate-based monomers and urethane (meth)acrylate oligomers at the weight ratio of 3:7 to 7:3, but also comprises organic particles having particle diameters of 1 μm to 10 μm, and inorganic particles having particle diameters of 1 nm to 500 nm. Thereby, the anti-glare film satisfies a difference between the total haze(Ha) and the internal haze(Hi), peak area rate, and transmission diffusion distribution in the above ranges, and thus, may have improved anti-glare property, and particularly, even if applied for a display panel requiring high resolution, sparkling may be prevented.

The organic particles may respectively have a particle diameter of 1 μm to 10 μm, 2 μm to 9 μm, 3.5 μm to 8 μm, or 3.5 μm to 7 μm. If the particle diameter of organic particle included in the hard coating layer is too small, it may be difficult to realize anti-glare property, and if the particle diameter is too large, sparkling may be generated.

The organic particles may have a refractive index of 1.500 to 1.600, 1.520 to 1.600, or 1.540 to 1.595, at the wavelength of 500 to 600 nm. By comprising organic particles having high refractive index as explained above in the hard coating layer, not only excellent anti-glare property may be exhibited, but also sparkling defect, Rainbow Mura generating inside a panel may be prevented.

The refractive index may be measured at a wavelength of 500 nm to 600 nm, using SPA-400 prism coupler of Sairon Technology.

The organic particles may be one selected from the group consisting of polystyrene, polymethylmethacrylate, polymethylacrylate, polyacrylate, polyacrylate-co-styrene, polymethylacrylate-co-styrene, polymethylmethacrylate-co-styrene, polycarbonate, polyvinylchloride, polybutylene terephthalate, polyethylene terephthalate, polyamides, polyimides, polysulfone, polyphenylene oxide, polyacetal, epoxy resin, phenol resin, silicon resin, melamine resin, benzoguanamine, polydivinylbenzene, polydivinylbenzene-co-styrene, polydivinylbenzene-co-acrylate, polydiallyl phthalate, and triallyl isocyanurate polymer, or a copolymer of two or more kinds thereof, but not limited thereto.

The content of the organic particles may be 5 to 30 parts by weight, 7 to 25 parts by weight, or 10 to 20 parts by weight, based on 100 parts by weight of the binder resin. If the content of the organic particles is too small, it may be difficult to realize anti-glare property, and if the content of the organic particles is too large, sparkling may be generated.

The inorganic particles may respectively have a particle diameter of 1 nm to 500 nm, 5 nm to 450 nm, 10 nm to 400 nm, or 15 nm to 350 nm. If the particle diameter of the inorganic particles included in the hard coating layer is too small, it may be difficult to realize anti-glare property, and if the particle diameter is too large, sparkling may be generated.

The inorganic particles may be one or more selected from the group consisting of silica, titanium dioxide, indium oxide, tin oxide, zirconium oxide, zinc oxide, and polysilsesquioxane particles, but not limited thereto. And, the polysilsesquioxane may be silsesquioxane particles of a cage structure.

The content of the inorganic particles may be 5 to 30 parts by weight, 10 to 27 parts by weight, or 15 to 22 parts by weight, based on 100 parts by weight of the binder resin. If the content of the inorganic particles is too small, it may be difficult to realize anti-glare property, and if the content of the inorganic particles is too large, sparkling may be generated.

The weight ratio of the organic particles and inorganic particles may be 1:0.2 to 1.5, 1:0.4 to 1.2, or 1:0.5 to 1.0. If the content of the inorganic particles is too small compared to the organic particles, anti-glare property may be deteriorated, and if the content of the inorganic particles is too large, sparkling may be generated, thus lowering image sharpness.

The organic particles and inorganic particles may respectively have a particle shape of sphere, elliptical sphere, rod or amorphous shape, and the like. In the case of rod or amorphous shape, the length of the largest dimension may satisfy a particle diameter of the above range.

And, the particle diameter of the organic particles and inorganic particles may be measured by dynamic light scattering, laser diffraction, centrifugal sedimentation, FFF (Field Flow Fractionation), pore electric resistance method, and the like.

The hard coating layer included in the anti-glare film may have two or more irregularities formed on the side opposing the light transmitting substrate. The irregularities may be formed due to the aggregation of organic particles, and thus, may comprise organic particles. In the irregularities, the whole organic particles may be included, or a part of the organic particles may be included, and for example, the organic particles may be included in the amount of 50 vol % or less.

In the entire organic particles included in the hard coating layer, a rate of two or more organic particles aggregating with each other in the thickness direction of the hard coating layer may be 5% or less. The 'aggregation' includes a case wherein two or more organic particles contact or a case wherein parts of the particles are overlapped, and the like.

In case two or more organic particles are aggregated, among one group consisting of two or more organic particles aggregating with each other, at least two organic particles may be positioned at different distances from one side of the hard coating layer. As such, by controlling the rate of two or more organic particles aggregating and existing at different positions in the thickness direction of the hard coating layer to 5% or less, or 4.5% or less, or 4% or less, or 3.5% or less, the shape of surface irregularities of the hard coating layer may be controlled, thereby significantly improving anti-glare property and image sharpness.

The 'two organic particles neighboring with each other among two or more organic particles aggregating with each other' mean two organic particles aggregating or directly contacting among one group consisting of two or more organic particles aggregating with each other.

The distance from one side of the hard coating layer to the organic particle means a minimum distance from one side of the hard coating layer to external one point of the organic particle, and for example, it is a minimum distance from one side of the hard coating layer to the surface of the organic particle.

Whether or not the organic particles are aggregated, or whether or not two organic particles neighboring with each other are positioned at different distances from one side of the hard coating layer may be confirmed by visually observing the optical film or using an optical device. For example, in the anti-glare film, two organic particles neighboring with each other among two or more organic particles aggregating with each other may respectively have an optical microscope focus at different positions in the thickness direction from one side of the hard coating layer. Namely, two organic particles neighboring with each other among two or more organic particles aggregating with each other exist at different positions in the thickness direction from one side of the hard coating layer, and thus, when observing while moving a focus in the thickness direction of the hard coating layer using optical microscope, the focus where each of two neighboring organic particles is confirmed, namely a position where each organic particle exists may be confirmed.

And, the above explained rate of aggregation may be calculated by confirming the number of aggregations, and then, dividing it by the number of entire particles existing in the same measurement plane.

As explained above, two organic particles neighboring with each other among two or more organic particles aggregating with each other may be positioned at different distances from one side of the hard coating layer, and for example, two organic particles neighboring with each other among two or more organic particles aggregating with each other may be positioned with a distance difference of 0.1 μm or more, 0.2 μm or more, 0.5 μm or more, 1 μm or more, or 2 μm or more from one side of the hard coating layer.

The hard coating layer having irregularities may have 10 point mean roughness(Rz) of 0.05 μm to 0.15 μm, 0.07 μm to 0.13 μm, or 0.09 μm to 0.11 μm. And, the hard coating layer may have mean spacing of profile irregularities(Sm) of 0.05 mm to 0.20 mm, 0.07 mm to 0.18 mm, or 0.09 mm to 0.15 mm.

The thickness of the hard coating layer may be 1 to 10 μm or 2 to 8 μm. If the thickness of the hard coating layer is less than 1 μm, it may be difficult to obtain hardness, and if the thickness is greater than 10 μm, when forming a hard coating layer, during curing of resin, it may be curled.

The thickness of the hard coating layer may be calculated by observing the cross-section of cut anti-glare film with scanning electron microscope(SEM), and measuring the thickness of the binder part of the hard coating layer.

Meanwhile, the hard coating layer may be obtained by coating a photocurable coating composition comprising the binder resin, organic particles and inorganic particles on the light transmitting substrate, and photocuring the coated product.

And, the photocurable coating composition may further comprise a photoinitiator. Thereby, in the hard coating layer prepared from the above explained photocurable coating composition, the photopolymerization initiator may remain.

As the photopolymerization initiator, compounds known to be usable in a photocurable coating composition may be used without specific limitations, and specifically, benzophenone-based compounds, acetophenone-based compounds, biimidazole-based compounds, triazine-based compounds, oxime-based compounds or a mixture thereof may be used.

Based on 100 parts by weight of the binder resin, the photopolymerization initiator may be used in the content of 1 to 10 parts by weight, 2 to 9 parts by weight, or 3 to 8 parts by weight. If the content of the photopolymerization initiator is too small, in the step of photocuring the photocurable coating composition, uncured and remaining material may be generated. If the content of the photopolymerization initiator is too large, unreacted initiators may remain as impurities or cross-linking density may be lowered, and thus, mechanical properties of the prepared film may be deteriorated.

And, the photocurable coating composition may further comprise an organic solvent. As non-limiting examples of the organic solvent, ketones, alcohols, acetates, ethers, benzene derivatives or a mixture thereof may be mentioned.

As specific examples of the organic solvents, ketones such as methylethylketone, methylisobutylketone, acetylacetone, or isobutylketone, and the like; alcohols such as methanol, ethanol, n-propanol, i-propanol, n-butanol, i-butanol, or t-butanol, and the like; acetates such as ethyl acetate, i-propyl acetate, or polyethyleneglycol monomethylether acetate, and the like; ethers such as tetrahydrofurane or propyleneglycol monomethylether, and the like; benzene derivatives such as toluene, xylene, aniline, and the like; or a mixture of two or more kinds thereof may be mentioned.

The organic solvent may be included in the photocurable coating composition by adding it when mixing the components included in the photocurable coating composition, or adding the components while being dispersed or mixed in the organic solvent. If the content of the organic solvent in the photocurable coating composition is too small, flowability of the photocurable coating composition may be deteriorated, and thus, defects such as stripe may be generated in the finally prepared film. And, if the organic solvent is added in an excessive amount, solid content may decrease, and coating and film formation may not be sufficiently achieved, and thus, the properties of film or surface properties may be deteriorated, and defects may be generated during drying and curing processes. Thus, the organic solvent may be included such that the concentration of the total solid contents included in the photocurable coating composition may become 1 wt % to 50 wt %, or 2 to 20 wt %.

Meanwhile, methods commonly used for coating the photocurable coating composition may be used without specific limitations, and for example, bar coating such as Meyer bar, gravure coating, 2 roll reverse coating, vacuum slot die coating, 2 roll coating, and the like may be used.

In the step of photocuring the photocurable coating composition, 200 to 400 wavelength ultraviolet rays or visible rays may be irradiated, and during the irradiation, the exposure amount may be preferably 100 to 4,000 mJ/cm$^2$. Exposure time is not specifically limited, and may be appropriately changed according to exposure device, wavelength of irradiated rays, or exposure amount. And, in the step of photocuring the photocurable coating composition, nitrogen purging may be conducted so as to apply nitrogen atmosphere condition.

The anti-glare film comprises a light transmitting substrate. The light transmitting substrate may be a plastic film having transparency, and it may have transmittance according to JIS K 7361 of 90% or more, 91% or more, or 92% or more.

And, the light transmitting substrate may be, for example, triacetyl cellulose(TAC), polyester(TPEE), polyethylene terephthalate(PET), polyimide(PI), polyamide(PA), aramide, polyethylene(PE), polyacrylate(PAR), polyether sulfone, polysulfone, diacetyl cellulose, polypropylene(PP), polyvinyl chloride, acryl resin(PMMA), polycarbonate(PC), epoxy resin, urea resin, urethane resin, melamine resin, and the like, but not limited thereto.

The light transmitting substrate may have in-plane retardation(Re) measured at a wavelength of 400 nm to 800 nm, or 5,000 nm to 25,000 nm, or 7,000 nm to 20,000 nm. In the optical film comprising the light transmitting substrate fulfilling such retardation, rainbow phenomenon due to interference of visible light may be prevented.

The in-plane retardation(Re) may be defined by the following Formula, when the thickness of the light transmitting substrate is defined as d, the refractive index of slow axis direction in the plane is defined as $n_x$, and the refractive index of fast axis direction in the plane is defined as $n_y$.

$$Re=(n_x-n_y)*d$$

And, the retardation value is an absolute value and may be defined as a positive number.

The thickness of the light transmitting substrate may be 10 to 300 μm, 30 to 250 μm or 40 to 200 μm considering productivity, and the like, but is not limited thereto.

According to another embodiment of the invention, there is provided a polarizing plate comprising the anti-glare film. The polarizing plate may comprise a polarizing film, and an anti-glare film formed at least one side of the polarizing film.

The materials and manufacturing methods of the polarizing plate are not specifically limited, and those commonly known in the art may be used. For example, the polarizing film may be a polyvinylalcohol-based polarizing film.

Between the polarizing film and the anti-glare film, a protection film may be provided. Examples of the protection film are not limited, and for example, it may be one or more of a COP(cycloolefin polymer)based film, an acryl-based film, a TAC(triacetylcellulose)-based film, a COC(cycloolefin copolymer)-based film, a PNB(polynorbornene)-based film, and a PET(polyethylene terephtalate)-film.

As the protection film, a substrate for forming a single coating layer when preparing the anti-glare film may be used as it is. The polarizing film and the anti-glare film may be laminated by adhesive such as aqueous adhesive or non-aqueous adhesive.

According to another embodiment of the invention, there is provided a display apparatus comprising the anti-glare film and a display panel.

Examples of the display apparatus are not limited, but for example, it may be a micro-LED (LED; Light Emitting Diode) display, a mini-LED display, a liquid crystal display, a plasma display, an organic light emitting diode, and the like.

For example, the display apparatus may be a micro-LED display comprising the anti-glare film and a micro-LED display panel, wherein the anti-glare film may be positioned at the visible side on the micro-LED display panel.

The micro-LED display panel may comprise a unit substrate, pixels comprising multiple LED chips mounted on the unit substrate, and the like, and the size(length of one side of the chip) of the LED chip constituting pixel for realizing high resolution may be 100 micrometer or less. And, the display panel may have resolution of 200 ppi or more, 300 ppi or more, or 400 ppi or more.

In case the existing anti-glare film is applied on the above explained micro-LED display panel, irregularities formed on the surface of the anti-glare film serve as lens for refracting light coming from pixel, thus generating sparkling. However, in the case of the anti-glare film satisfying a difference between the total haze(Ha) and the internal haze(Hi), peak area rate, and transmission diffusion distribution within the above explained specific numerical ranges, cohesion of surface irregularities may be appropriately controlled, and refraction of light coming from pixel may be prevented, and thus, while maintaining excellent anti-glare property, sparking may be prevented, and image sharpness may be improved.

For another example, the display apparatus may be a liquid crystal display comprising one pair of polarizing plates opposing with each other; a thin film transistor, a color filer and a liquid crystal cell sequentially laminated between the one pair of polarizing plates; and a back light unit. In the display apparatus comprising an anti-glare film, the anti-glare film may be positioned on one side of the polarizing plate relatively distant from the back light unit, among the one pair of polarizing plates.

ADVANTAGEOUS EFFECTS

According to this invention, there are provided an anti-glare film that exhibits excellent anti-glare property, and simultaneously, prevents sparkling, and exhibits excellent optical properties such as high transmittance, and simultaneously, has excellent physical properties such as scratch resistance, high intensity and anti-pollution property, and the like, and a polarizing plate and a display apparatus comprising the same.

This invention will be explained in more detail in the following Examples. However, these examples are presented only as the illustration of the invention, and the scope of the invention is not limited thereby.

Preparation Example 1: Preparation of a Coating Solution for Forming a Hard Coating Layer 50 g of pentaerythritol triacrylate, 50 g of MU9800 (9 functional urethane acrylate-based oligomer, manufacturing company: Miwon, weight average molecular weight: 3500 g/mol, equivalent weight of acrylate groups: 389 g/mol), 7 g of an initiator D1173 (manufacturing company: Ciba), 100 g of a solvent methylisobutylketone, 21 g of MA-ST (nano silica particles, manufacturing company: Nissan Chemical, particle diameter: 10~15 nm, 30% in methanol), and 12 g of PS-a (polystyrene spherical particles, particle diameter 3.5 μm, refractive index: 1.595) were mixed to prepare a composition for forming a hard coating layer of Preparation Example 1.

Wherein, the particle diameter of each particle was measured by a dynamic light scattering method.

Preparation Example 2: Preparation of a Coating Solution for Forming a Hard Coating Layer 30 g of pentaerythritol triacrylate, 70 g of MU9800, 7 g of an initiator D1173, 100 g of a solvent methylisobutylketone, 17 g of MA-ST, and 12 g of PS-a were mixed to prepare a composition for forming a hard coating layer of Preparation Example 2.

Preparation Example 3: Preparation of a Coating Solution for Forming a Hard Coating Layer 50 g of pentaerythritol triacrylate, 50 g of MU9800, 7 g of an initiator D1173, 100 g of a solvent methylisobutylketone, 20 g of PMA-ST (nano silica particles, manufacturing company: Nissan Chemical, particle diameter: 10~15 nm, 30% in propyleneglycol monomethylether acetate), 8 g of PS-a, and 3 g of PS-PMMA-a (polystyrene-polymethyl methacrylate copolymer spherical particles, particle diameter 3.5 μm, refractive index: 1.555) were mixed to prepare a composition for forming a hard coating layer of Preparation Example 3.

Preparation Example 4: Preparation of a Coating Solution for Forming a Hard Coating Layer 50 g of pentaerythritol triacrylate, 50 g of MU9800, 7 g of an initiator D1173, 100 g of a solvent methylisobutylketone, 1.2 g of MA-ST, and 5 g of PS-PMMA-b (polystyrene-polymethyl methacrylate copolymer spherical particles, particle diameter 2 μm, refractive index: 1.555) were mixed to prepare a composition for forming a hard coating layer of Preparation Example 4.

Preparation Example 5: Preparation of a Coating Solution for Forming a Hard Coating Layer 100 g of pentaerythritol triacrylate, 7 g of an initiator D1173, 100 g of a solvent methylisobutylketone, 27 g of MA-ST, and 12 g of PS-a were mixed to prepare a composition for forming a hard coating layer of Preparation Example 5.

Preparation Example 6: Preparation of a Coating Solution for Forming a Hard Coating Layer 100 g of EB1290 (6 functional urethane acrylate oligomer, manufacturing company: SK Cytec, weight average molecular weight: 1,000 g/mol, equivalent weight of acrylate groups: 167 g/mol), 7 g of an initiator D1173, 100 g of a solvent methylisobutylketone, 23 g of MA-ST, and 12 g of PS-a were mixed to prepare a composition for forming a hard coating layer of Preparation Example 6.

Preparation Example 7: Preparation of a Coating Solution for Forming a Hard Coating Layer 50 g of pentaerythritol triacrylate, 50 g of EB1290, 7 g of an initiator D1173, 50 g of a solvent methylisobutylketone, 50 g of toluene, 8 g of PS-b (polystyrene spherical particles particle diameter 2 μm, refractive index: 1.595), and 8 g of SS-50B (surface treated hydrophobic silica particles, manufacturing company: Tosoh, particle diameter 2 μm) were mixed to prepare a composition for forming a hard coating layer of Preparation Example 7.

Preparation Example 8: Preparation of a Coating Solution for Forming a Hard Coating Layer 50 g of of pentaerythritol triacrylate, 50 g of EB1290, 7 g of an initiator D1173, 50 g of a solvent methylisobutylketone, 50 g of toluene, and 12 g of SS-50B were mixed to prepare a composition for forming a hard coating layer of Preparation Example 8.

Examples and Comparative Examples: Preparation of Anti-Glare Films

The compositions for forming a hard coating layer of Preparation Examples 1 to 8 were respectively coated on a light transmitting substrate triacetyl cellulose (TAC, thickness 60 μm) by #10 meyer bar as shown in the following Table 1, and dried at 90° C. for 1 minute. To the dried products, 150 mJ/cd ultraviolet rays were irradiated to form hard coating layers and anti-glare films. Wherein, the thickness of the hard coating layer was described in the following Table 1.

TABLE 1

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Hard coating layer | Preparation Example 1 | Preparation Example 2 | Preparation Example 3 | Preparation Example 4 | Preparation Example 5 | Preparation Example 6 | Preparation Example 7 | Preparation Example 8 |

TABLE 1-continued

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Thickness of a hard coating layer (μm) | 5 | 5 | 5 | 4 | 5 | 5 | 5 | 5 |

EXPERIMENTAL EXAMPLE

1. Peak Area Rate ($I_B/I_A$) in IR Spectrum

For the hard coating layer of each anti-glare film obtained in Examples and Comparative Examples, IR measurement was conducted using Cary 660(Agilent), and in the derived IR spectrum, a rate($I_B/I_A$) of the peak area ($I_B$) existing between 1500 cm$^{-1}$ to 1570 cm$^{-1}$, to the peak area ($I_A$) existing between 1690 cm$^{-1}$ to 1745 cm$^{-1}$ was calculated, and the results were shown in the following Table 2.

Wherein, IR measurement conditions are as follows.

ATR: PIKE Technologies 025-2018 Miracle Znse perf crystal plate measurement wavelength: 400 to 4000 nm measurement temperature: 25° C.

2. Measurement of Transmittance and Haze 4 cm×4 cm specimens were prepared from each anti-glare film obtained in Examples and Comparative Examples, and haze was measured three times with a haze measuring device(HM-150, A light source, Murakami) and the average value was calculated, which was determined as the total haze value. Wherein, transmittance and total haze were simultaneously measured, and transmittance was measured according to JIS K 7361 standard, and haze was measured according to JIS K 7136 standard.

When measuring the internal haze, an adhesive film having the total haze of 0 was attached to the hard coating layer to planarize surface irregularities, and then, the internal haze was measured by the same method as the total haze measurement method.

3. Transmission Diffusion Distribution

Each anti-glare film obtained in Examples and Comparative Examples was mounted on a goniometer(GC5000L, Nippon Denshoku Industries Co., Ltd.), and light was irradiated in the normal direction of the light transmitting substrate of the anti-glare film, and then, the intensity of light transmitted to the hard coating layer was measured. Wherein, the intensity of light transmitted in the normal direction of the hard coating layer was determined as transmission intensity(A), and the intensity of light transmitted at +1° or −1° based on the normal of the hard coating layer was determined as transmission diffusion intensity(B), and they were substituted in the following Formula 1, thus calculating transmission diffusion distribution, and the results were shown in the following Table 4.

Transmission diffusion distribution=($B/A$)×100    [Formula 1]

4. Measurement of Specular Reflection Intensity Rate

A flat polyethylene terephthalate film coated with black adhesive without irregularity or flexure was put on one side of the light transmitting substrate so as to oppose the hard coating layer of each anti-glare film obtained in Examples and Comparative Examples. And then, the specimen was mounted on a goniometer(GC5000L, Nippon Denshoku Industries), and light was irradiated at an angle of 45° from the normal of a plane to the hard coating layer of the specimen. After irradiating light to the plane of the hard coating layer, reflection intensity(C) was measured at 45°, which corresponds to specular reflection of incident angle.

And, on one side of the light transmitting substrate where the hard coating layer was not formed in Examples and Comparative Examples, a flat polyethylene terephthalate film coated with black adhesive without irregularity or flexure was put to prepare a specimen, and reflection intensity(D) was measured by the same method as the measurement method of reflection intensity(C).

The measured reflection intensities C and D were substituted in the following Formula 2 to calculate specular reflection intensity rate, and the results were shown in the following Table 2.

Specular reflection intensity rate=($C/D$)×100    [Formula 2]

5. Confirmation of Generation of Sparkling

For each anti-glare film obtained in Examples and Comparative Examples, a 12 cm×12 cm sample was prepared, and then, attached to a slide glass with a transparent adhesive film(OCA). And then, the sample was put on a panel with a resolution of 400 ppi so that the hard coating side faced upward. Wherein, tape may be attached to four-sides so that the film may not be lifted. And then, the panel was operated so that a white screen may be seen, and then, it was confirmed whether or not sparkling was generated within 10 cm×10 cm area of the sample. The evaluation standard is as follows, and the results were shown in the following Table 2.

Good: no sparkling of light

Bad: light sparkling

6. Evaluation of Anti-Glare Property

A flat polyethylene terephthalate film coated with black adhesive without irregularity or flexure was put on one side of the light transmitting substrate so as to oppose the hard coating layer of each anti-glare film obtained in Examples and Comparative Examples, thus preparing a specimen. And then, using fluorescent lamp lighting with 2 rows of lamps as a light source, visible range from the specular reflection direction of each anti-glare film was observed, thus measuring visibility by distinguishing the reflected image of fluorescent lamp. The visibility evaluation standard is as follows, and the results were shown in the following Table 2.

Good: No lamp image observed

Bad: Lamp image clearly seen

TABLE 2

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Peak area rate | 0.331 | 0.521 | 0.332 | 0.342 | 0 | 0.705 | 0.352 | 0.352 |
| transmittance (%) | 90.8 | 90.7 | 91.0 | 91.2 | 90.7 | 90.7 | 90.5 | 90.0 |
| Total haze (%) | 37 | 36 | 31 | 3.7 | 38 | 35 | 39 | 25 |
| Internal haze (%) | 27 | 26 | 20 | 3 | 24 | 28 | 21 | 0 |
| Transmission diffusion distribution (%) | 5.3 | 6.2 | 5.5 | 1.2 | 12.0 | 3.2 | 62.0 | 53.0 |
| Specular reflection intensity rate (%) | 5.50 | 6.30 | 5.40 | 32.00 | 2.80 | 10.80 | 0.72 | 0.65 |
| Sparkling | Good | Good | Good | Good | Bad | Good | Bad | Bad |
| Anti-glare property | Good | Good | Good | Bad | Good | Bad | Good | Good |

As shown in Table 2, it was confirmed that the anti-glare films of Examples 1 to 3 satisfy internal haze of 10 or more, difference between the total haze and the internal haze of 5 to 15%, and peak intensity rate of 0.1 to 0.6, and thus, sparkling was not generated, and simultaneously, excellent anti-glare property was exhibited. To the contrary, it was confirmed that in Comparative Examples 1 to 5, sparkling was generated or anti-glare property was bad.

What is claimed is:

1. An anti-glare film comprising:
a laminate comprising a light transmitting substrate, and a hard coating layer comprising a binder resin, and inorganic particles and organic particles dispersed in the binder resin,
wherein a difference (Ha−Hi) between a total haze (Ha) and an internal haze (Hi) of the laminate is 5 to 15%, and
in the infrared (IR) spectrum of the laminate, a rate (I B/I A) of the peak area (I B) existing between 1500 cm-1 to 1570 cm-1, to the peak area (I A) existing between 1690 cm-1 to 1745 cm-1 is 0.1 to 0.6, and
a transmission diffusion distribution of the laminate according to the following Formula 1 is greater than 1% and less than 10%:

Transmission diffusion distribution=(B/A)×100   [Formula 1]

wherein A is transmission intensity of light transmitted in the normal direction of the hard coating layer, after irradiating light in the normal direction of the light transmitting substrate, and
B is transmission diffusion intensity of light transmitted at +1° or −1° based on the normal direction of the hard coating layer, after irradiating light in the normal direction of the light transmitting substrate.

2. The anti-glare film according to claim 1,
wherein a specular reflection intensity rate of the laminate according to the following Formula 2 is greater than 1% and less than 10%:

Specular reflection intensity rate=(C/D)×100   [Formula 2]

in the Formula 2,
C is reflection intensity measured at 45° corresponding to specular reflection, after irradiating light at the incidence angle of 45° to the hard coating layer, and
D is reflection intensity measured at 45° corresponding to specular reflection, after irradiating light at the incidence angle of 45° to the light transmitting substrate.

3. The anti-glare film according to claim 1,
wherein the total haze of the laminate is 20% to 50%, and the internal haze of the laminate is 10% to 40%.

4. The anti-glare film according to claim 1,
wherein the binder resin comprises multifunctional (meth)acrylate-based monomers and urethane (meth)acrylate oligomers at weight ratio of 3:7 to 7:3.

5. The anti-glare film according to claim 1,
wherein each of the organic particles has a particle diameter of 1 μm to 10 μm.

6. The anti-glare film according to claim 1,
wherein each of the inorganic particles has a particle diameter of 1 nm to 500 nm.

7. The anti-glare film according to claim 1,
wherein a weight ratio of the organic particles and inorganic particles is 1:0.2 to 1.5.

8. The anti-glare film according to claim 1,
wherein the binder resin comprises multifunctional (meth)acrylate-based monomers and urethane (meth)acrylate oligomers at weight ratio of 3:7 to 7:3; and the organic particles have particle diameters of 1 μm to 10 μm and the inorganic particles have particle diameters of 1 nm to 500 nm.

9. The anti-glare film according to claim 1,
wherein two or more irregularities comprising the organic particles are formed on the surface of the hard coating layer.

10. The anti-glare film according to claim 1,
wherein a rate of two or more organic fine particles aggregating with each other in the thickness direction of the hard coating layer is 5% or less, based on the total organic particles.

11. The anti-glare film according to claim 1,
wherein a 10 point mean roughness (Rz) of the hard coating layer is 0.05 μm to 0.15 μm, and a mean spacing of profile irregularities (Sm) of the hard coating layer is 0.05 mm to 0.20 mm.

12. The anti-glare film according to claim 1,
wherein in-plane retardation (Re) of the light transmitting substrate, measured at a wavelength of 400 nm to 800 nm, is 5,000 to 25,000 nm.

13. A polarizing plate comprising the anti-glare film according to claim 1.

14. A display apparatus comprising the anti-glare film according to claim 1 and a display panel.

15. The display apparatus according to claim 14, wherein the display panel has a resolution of 200 pixels per inch (ppi) or more.

* * * * *